United States Patent [19]

Anderson et al.

[11] Patent Number: 5,254,939
[45] Date of Patent: Oct. 19, 1993

[54] PROBE CARD SYSTEM

[75] Inventors: James C. Anderson, Santa Rosa; Brian P. Phillips, Glen Ellen; Charles Honek, Santa Rosa, all of Calif.

[73] Assignee: Xandex, Inc., Petaluma, Calif.

[21] Appl. No.: 855,763

[22] Filed: Mar. 20, 1992

[51] Int. Cl.⁵ .............................................. G01R 1/02
[52] U.S. Cl. ............................ 324/158 P; 324/158 F
[58] Field of Search ............ 324/158 P, 158 F, 158 R, 324/73.1; 439/482; 414/222, 225, 749; 198/573

[56] References Cited

U.S. PATENT DOCUMENTS

| | | | |
|---|---|---|---|
| 4,105,970 | 8/1978 | Katz | 324/158 P |
| 4,746,855 | 5/1988 | Wrinn | 324/73 R |
| 4,935,696 | 6/1990 | DiPerna | 324/158 F |
| 5,019,771 | 5/1991 | Yang et al. | 324/158 P |
| 5,030,907 | 7/1991 | Yih et al. | 324/158 F |

FOREIGN PATENT DOCUMENTS

| | | |
|---|---|---|
| 1-161173 | 6/1989 | Japan . |
| 0001141 | 1/1990 | Japan .............................. 324/158 P |
| 2066590 | 7/1981 | United Kingdom . |
| 2242081 | 9/1991 | United Kingdom . |

*Primary Examiner*—Vinh Nguyen
*Attorney, Agent, or Firm*—Townsend and Townsend/Khourie and Crew

[57] ABSTRACT

A semiconductor wafer probe test interface system (2) and method of operating the system. The wafer probe system includes a plurality of cassettes (302) adapted to hold wafer probe test cards (304). The cassettes are loaded into position for testing of semiconductor wafers with a transport assembly system (6). A memory device (316) on the cassette is used to store data regarding usage of the card such as number of wafer touchdowns. A smart controller (220) has the capability to "talk" to the prober and tester.

29 Claims, 17 Drawing Sheets

Microfiche Appendix Included
(172 Microfiche, 2 Pages)

PROBE CARD SYSTEM

MICROFICHE APPENDIX

This specification includes microfiche Appendix 1 having 2 sheets with 172 frames.

COPYRIGHT NOTICE

A portion of the disclosure of this patent document contains material which is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

BACKGROUND OF THE INVENTION

The present invention relates to the field of electronic test systems. More specifically, in one embodiment the invention provides an improved method and device for performing tests on semiconductor wafers, such methods otherwise known as wafer test via probing.

Various types of wafer test and probe equipment are well known to those of skill in the art, and are broadly used in semiconductor manufacturing operations. Such equipment is used to provide electrical signals to a semiconductor die, generally formed on a wafer, and monitor the response of the die to the electrical signals. Wafer test and probe equipment is made by a variety of manufacturers including, for example, Electroglas, KLA, Teradyne, Schlumberger, and Trillium.

The tests are normally conducted prior to dicing the wafer and chip packaging. The wafer is placed on a prober chuck, indexed, and each die is tested. The testing operation normally involves placing a probe card with a number of probe tips in contact with the die at selected locations (for example, the bond pads). Predetermined voltage patterns are then applied to the die, and the response of the die to the signals is monitored. If the die exhibits an appropriate response, the die is assumed to be "good." Otherwise the die is rejected, or appropriate remedial actions are taken. Such tests are performed on a wide variety of semiconductor products ranging from DRAMs and SRAMs to microprocessors and the like.

As semiconductor devices operate faster, it has become necessary to adopt "overhead" test techniques. In this technique, a section of the tester referred to as the test head is positioned on the top plate of the prober and then docked. Lines of signal transmission are, therefore, kept very short, avoiding cross-talk at high frequencies. Using these techniques involves the use of a printed circuit board with a plurality of pins extending downwardly therefrom. While meeting with substantial success, such prior systems have also exhibited certain difficulties. For example, electrical contact to the die is often made via delicate metallic pins extending from the PCB or probe card. The arrangement of the pins on the probe card, and the circuitry on the probe card varies from application to application. For example, the arrangement of pins on a 1M DRAM will be radically different than the arrangement of pins on a 4M DRAM, and the arrangement of both of the pins on a DRAM will obviously vary radically from the arrangement of pins on a microprocessor.

Therefore, when it is desired to switch test equipment from one product to another, it is necessary to remove the probe card and replace the probe card with a different probe card. This has often been a time consuming and difficult task for a number of reasons. For example, in many systems the probe card is mounted under a test head, which must be undocked before the probe card may be removed. This is often difficult because most test heads weigh between 250 and 750 pounds. Further, the interface between the test head and the probe card must be disassembled and reassembled. Still further, recalibration is required after replacement of a probe card.

Further, the probe cards often require maintenance after repeated contacts with semiconductor wafers, particularly due to damage to the contact pins on the probe cards. Conventionally, those of skill in the art have had no effective way of recording the operating history of a probe card. Therefore, contact failures are detected using, for example, the methods such as the ones disclosed in U.S. Pat. No. 5,019,771 and the card is replaced or repaired after a failure occurs. Since the problem is corrected when it arises, this procedure often results in undesirable down time.

It becomes particularly difficult to maintain records on individual probe cards when the probe cards are frequently moved into and out of a probe system due to, for example, changes in the products which are tested by the system. In such operations it becomes necessary to manually label the various probe cards, and manually enter information regarding probe card usage on data sheets or into a computer. This often becomes difficult or impractical when a large number of cards are in use, and is susceptible to human error.

From the above it is seen that an improved system and method for conducting wafer probe tests is needed.

SUMMARY OF THE INVENTION

An improved prober to test head interfacing system and method is provided by virtue of the present invention, otherwise referred to herein as an autoloader. The system provides for easy replacement of the probe card, and for a systematic method and device for probe card data collection.

The autoloader system includes a prober, and a tester having a test head. A variety of wafer probe cards are mounted in removable cassettes. The cassettes are easily transported into and out of the prober without undocking the test head.

A non-volatile or battery backed-up memory device is mounted on the probe card or the cassette. The memory device records various performance and operating data regarding the probe card including, for example, contact failures the location of the probes which failed, touchdowns, date of last repair/alignment, date of manufacture, and the like. The memory device is removed with and remains attached to the probe card or probe card cassette, even when the probe card is removed from the autoloader system. The memory device is preferably a serial device, preferably requiring only a single contact for data transmission, thus eliminating the need for a multi-pin connection.

The memory may be polled either by the autoloader system (when inserted in the autoloader system) or in an auxiliary device located, for example, at a probe card maintenance station. When the data recorded on the probe card memory includes, for example, contact failure locations, it becomes easy to repair an individual probe card after it is removed from service for maintenance. Accordingly, it becomes possible to maintain a collection of diverse probe card types, while still maintaining performance data on individual cards.

In addition, the invention provides a number of additional features. For example, the system allows for standardized tester interfaces, provides for probe card protection (in its cassette), and provides for motorized, repeatable probe tip to pad alignment. At the same time, the cassette system can be retrofitted to existing wafer probe systems or designed into new systems. Other features of the system herein include a data link to the tester through a GPIB (general purpose interface bus) or similar interface. Also, a data link is provided to the prober, allowing probe card or other user information to be written to the prober video display, or information stored in the prober may be written to the autoloader LCD.

Accordingly, one embodiment of the invention provides a wafer test system. The system includes a number of cassettes, each cassette holding a wafer probe card. The cassettes further include a semiconductor memory for recording information such as a number of probe card touchdowns. The system also includes a device for inserting the cassettes into and removing the cassettes from the test system.

A wafer probe cassette is also disclosed, which includes a wafer probe card. The probe card includes a plurality of wafer contacts for providing electrical signals to a device under test. The cassette further includes a memory for recording a number of touchdowns or other data relating to wafer probe card usage. Preferably, the cassette biases the probe card in a position that will protect the contacts.

A wafer probe card loading system is also disclosed. The wafer probe card loading system includes a system for moving wafer probe card cassettes into and out of a wafer test system, the cassettes holding a wafer probe card. The probe card loading system includes an electrical interface to the cassettes for recording data regarding probe card usage in the memory on the cassettes.

A further understanding of the nature and advantages of the inventions herein may be realized by reference to the remaining portions of the specification and the attached drawings.

DESCRIPTION OF THE PREFERRED EMBODIMENTS

Figure 1:
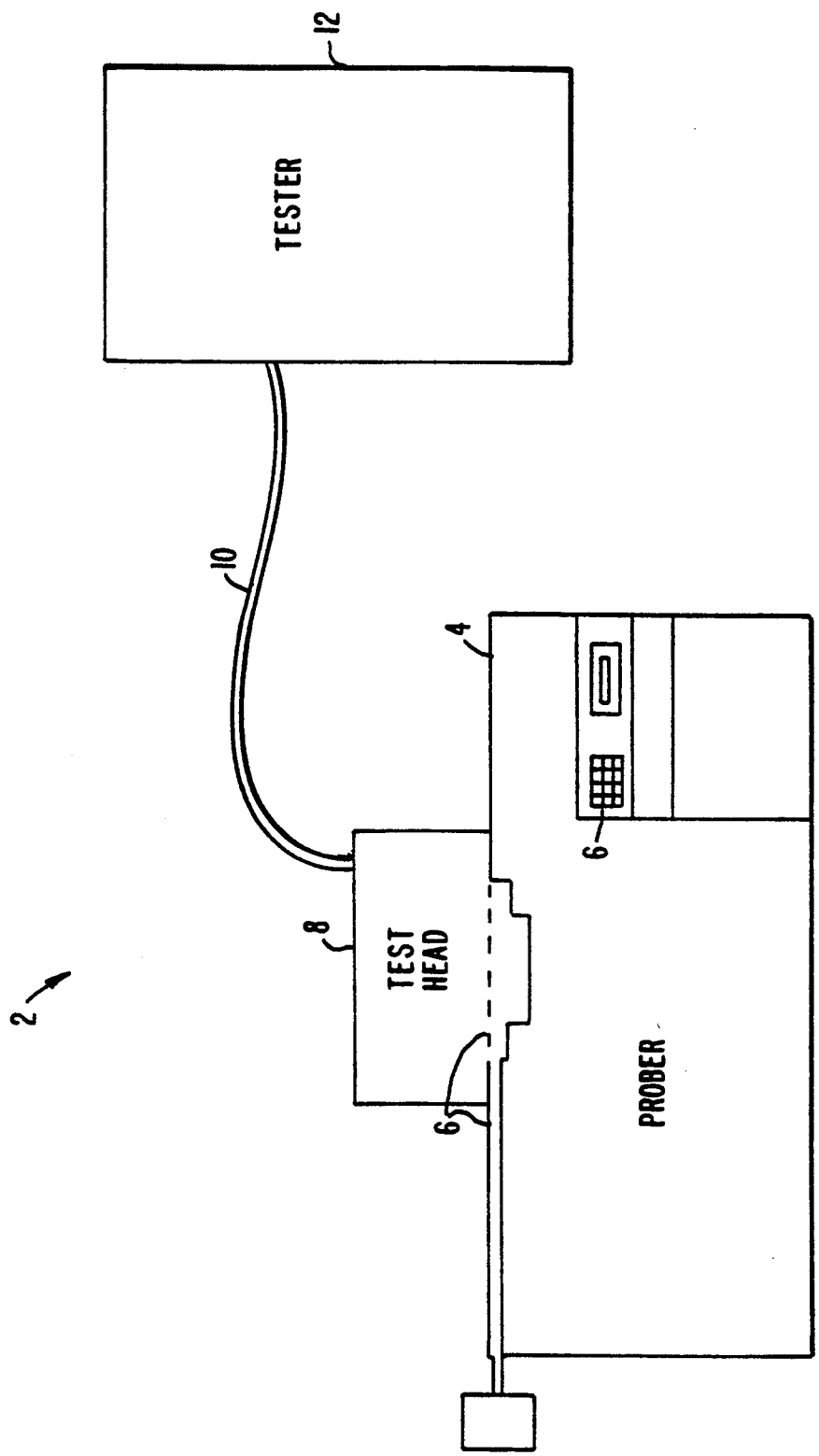
FIG. 1 is an overall view of a wafer probe system.

FIG. 1 is an overall block diagram illustrating a wafer probe system 2 according to one embodiment of the invention herein. The system includes a wafer prober 4, which includes a wafer probe card autoloader assembly 6. The prober contains mechanical elements for moving wafers into position for testing, and various associated electronics of the type known to those of skill in the art.

The autoloader assembly serves as an interface between the wafer prober 4 and a test head 8.

The test head 8 is connected by various conductors 10 to a tester 12. The tester 12 contains the necessary computer processing facilities to direct the application of test signals to the wafer or device under test (DUT), and to record and interpret the response of the wafer to the signals.

Figure 2:
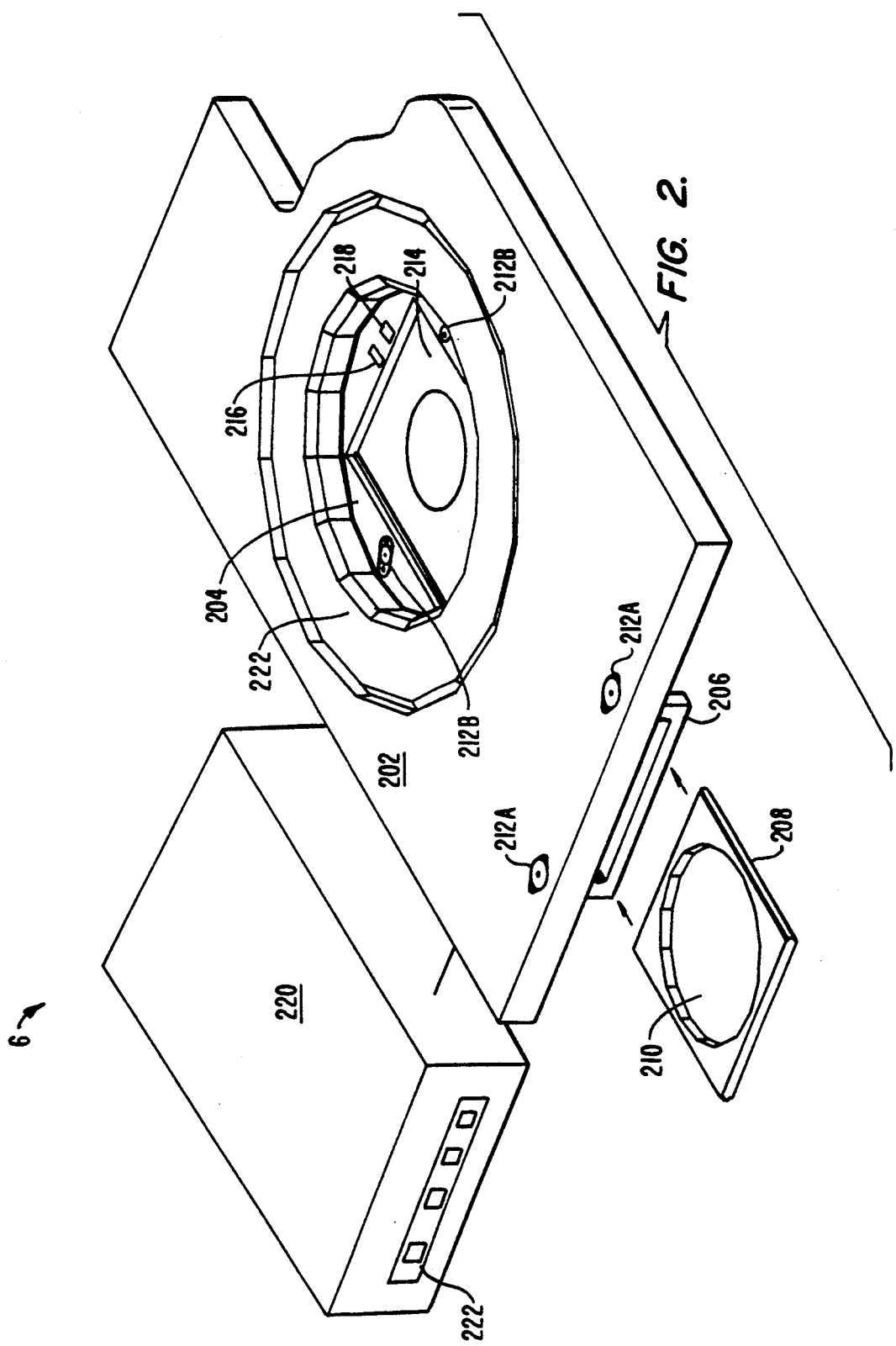
FIG. 2 is an expanded view of the autoloader

FIG. 2 is an expanded view of the probe card cassette autoloader assembly 6. As shown, the autoloader assembly includes a body (ring carrier) 202 having a depression. The depression holds a theta ring 222, which has a recession 204 therein. Within or under the body 202, track or rails 206 are mounted and form a transport assembly. The track 206 is sized to receive a probe card cassette 208, into which a probe card (not shown in FIG. 2) is mounted in recess 210.

Stepper motors 212a and 212b are used to drive the cassette into its operational position, generally denoted by reference numeral 214. When in the position 214, the wafer probe, with metallic pins extending downwards, is contacted with a wafer (not shown) and appropriate signals are applied thereto. The response of the various die on the wafer is monitored, and appropriately recorded.

The autoloader assembly is preferably provided with one or more cassette probe card position sensors 216 that are used to detect when the cassette is in its appropriate position, and deactivate the stepper motors. Stepper motors 212b are used to push the cassette out of position when it is desired to remove the cassette. A controller 220 is used to drive the operation of the autoloader. The controller includes a user interface display 222. Optionally, the display is placed on a prober video display.

Figure 3:
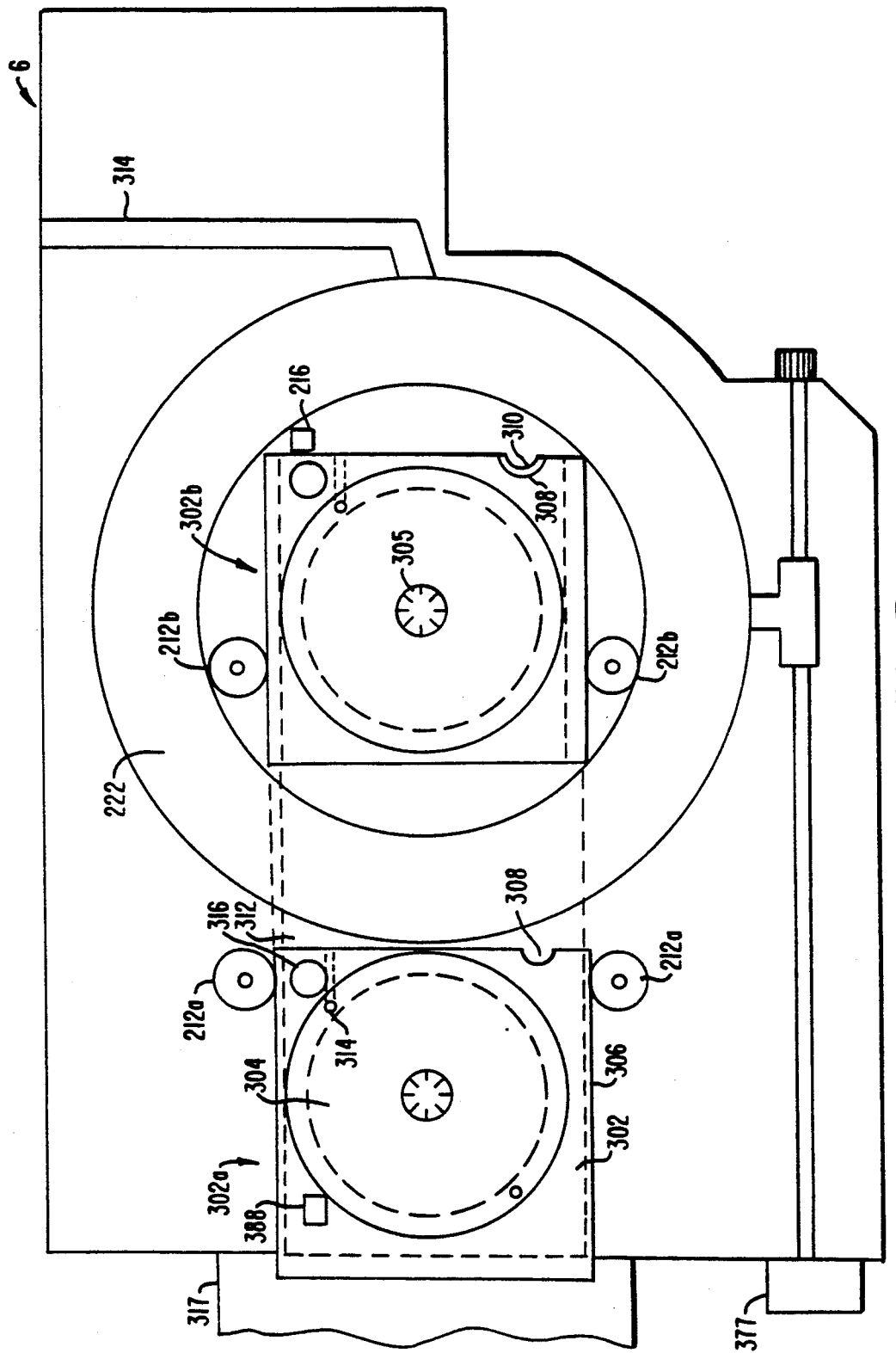
FIG. 3 illustrates additional features of the autoloader assembly.

FIG. 3 illustrates additional features of the autoloader assembly. In general, it is desirable to fabricate the body of the autoloader to fit inside existing wafer probe systems, without major machining work to the wafer probe systems. The particular shape of the body of the autoloader shown in FIGS. 2 and 3 is particularly suited to wafer probe systems such as a Series 2000 made by Electroglas, although the shape will obviously vary from prober to prober. The system is preferably modular, such that it can be added to such systems without major electronic changes to the wafer probe system.

In FIG. 3, a probe card cassette 302 is shown both in the outward position 302a, in which the cassette has just been inserted into the autoloader where the device can read a serial memory cell 316, and in the inward position 302b, in which the cassette has been moved into the correct position for wafer probe operations. As shown, the cassette includes a probe card 304. The cassette system shown herein may easily utilize existing probe cards. The probe card is spring loaded in the cassette to avoid protrusion of probe tips past the cassette skin during transport. This reduces the possibility of damaging tips during transport and/or storage. Attached to the probe card are various wafer probes 305. They will protrude below the bottom of the cassette only when the cassette is fully loaded and then will be used to make contact with a wafer. At other times, the probe card is spring biased in the cassette such that the probes do not extend below the cassette body.

The cassette assembly 302 contacts stepper motors 212a upon entry into the loader, and slides in rails 306. The presence of a cassette at the entry to the system is detected with appropriate detectors such as a memory cell data transfer device 388a and the stepper motors are activated accordingly, driving the cassette into the system. As the cassette moves into the system, its memory 316 will be read and then the cassette will be contacted with internal stepper motors 212b. The cassette is then driven into the system until the cassette is detected by position sensor 216. Detection of the cassette by the position sensor deactivates the stepper motors.

Proper alignment of the cassette in the system will be important. Coarse alignment is achieved through engagement of one or more notches 308 on the cassette with a corresponding extension 310 on the body of the autoloader. The probe card will normally need to be more carefully aligned, however. This is accomplished by manual or motorized theta adjustment of the probe card mounted in the cassette, and biased upwards with springs in the cassette. The card is then pulled towards the test head via theta ring pistons. Vacuum is applied to vacuum lines 314, which are connected to the cylinder portion of the theta ring assembly 222. Accordingly, upon reaching the top of the theta ring travel, the probe card is pushed down inside the cassette by the force of the contactors of the test head. Probe tips are then aligned to the pads on the wafer by the theta motor 377. This arrangement will keep the probe card in a safe, upwards position when not in use.

Existing probe cards may be used in the cassette by placing mounting pins on the cassette in a proper position for engagement of standardized mounting hole arrangements on the probe card. Such probe cards are made by, for example, Probe Technology Corporation. Optionally, the probe card cassettes may be loaded from a cassette magazine 317. Preferably, the user or the test system is able to identify the product on the wafer with the user interface and the proper cassette enclosed probe card is chosen from the magazine.

Importantly, the cassette 302 is provided with writable memory 316. In some embodiments, the memory is erasable memory such as static random access memory (SRAM), or a battery backed-up dynamic random access memory such as (DRAM), although it will be apparent that write-only memory may be used in some embodiments. A memory cell data transfer device is located on the transport assembly. Data are loaded onto and read from the memory device in a preferred embodiment via a single data pin 388 in a serial manner. The single data pin contacts a large surface of the memory cell, which has the appearance of a small battery. Accordingly, precise alignment to the memory is not required in preferred embodiments, although alternative embodiments will provide for data transfer to/from the memory via a more conventional multi-pin connector. Ground is preferably provided via the cassette/body mechanical connections.

A variety of operational data about the probe card in the cassette are written to memory 316 from the controller via the memory cell data transfer device 388 which is located in the transport assembly. Table 1 lists various types of operational data which are recorded in the memory according to preferred embodiments and the source of the data. A real time clock is also provided on the cassette for time stamping when used and when the probe card is repaired and duration.

TABLE 1

|  | Source of Data |
| --- | --- |
| Touchdowns | Loading assembly |
| Serial number | Input @ PC maint. station |

TABLE 1-continued

|  | Source of Data |
| --- | --- |
| Date of last maintenance | Input @ PC maint. station |
| Date of manufacture | Input @ PC maint. station |
| Failure nature of probes | GPIB-tester |
| Location of failed probes | GPIB-tester |
| Operators' I.D. | Loading assembly |
| Scheduled maintenance date | Input @ PC maint. station |
| Scheduled maintenance touchdowns | Input @ PC maint. station |
| Previous theta location | Input @ PC maint. station |

Importantly, the memory is used to store information about the number of times the card has made contact with wafers (touchdowns) since the last service of the probe card. Other important information which may be stored on the memory include the number of failed contacts of individual or groups of probes and their location, serial nu of last maintenance, or the like. This maintenance history information may optionally read back by the user in a separate device at any convenient time, enabling the user to identify cards that have been used extensively and which should be serviced, or cards which have exhibited failure rates and which should be serviced or replaced.

Since the memory is resident on the cassette, there is no need to provide a method of associating the stored information with a particular card. This greatly facilitates the "book keeping" for the probe card performance and usage data. A convenient memory device is a Dallas Semiconductor DS1994, although it will be apparent that a wide variety of storage devices may be used without departing from the scope of the invention. Such devices are placed in a "can" with one surface used for data transfer and another surface used for ground.

In order to provide for automatic operation of the loader, it will be desirable to install various proximity switches for detection of the cassette, piston, and chuck positions in the machine (not shown). In a preferred embodiment, switches are provided at the entrance to the unit at the chuck safe position, at the fully inserted position of the cassette, and in the theta ring assembly.

Figure 4A:
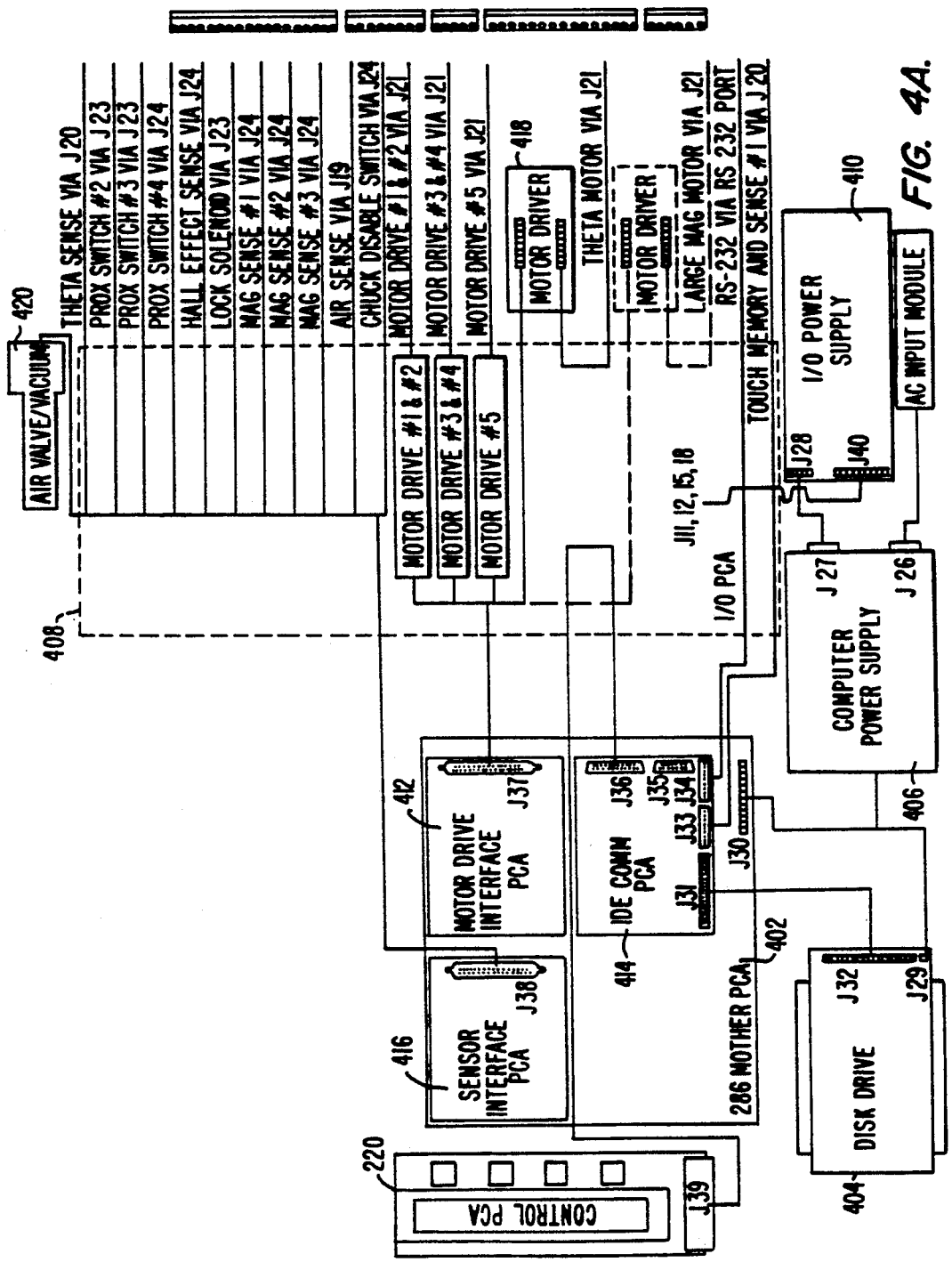
FIGS. 4A to 4B are circuit block diagrams illustrating the electric of the autoloader assembly.
Figure 4B:
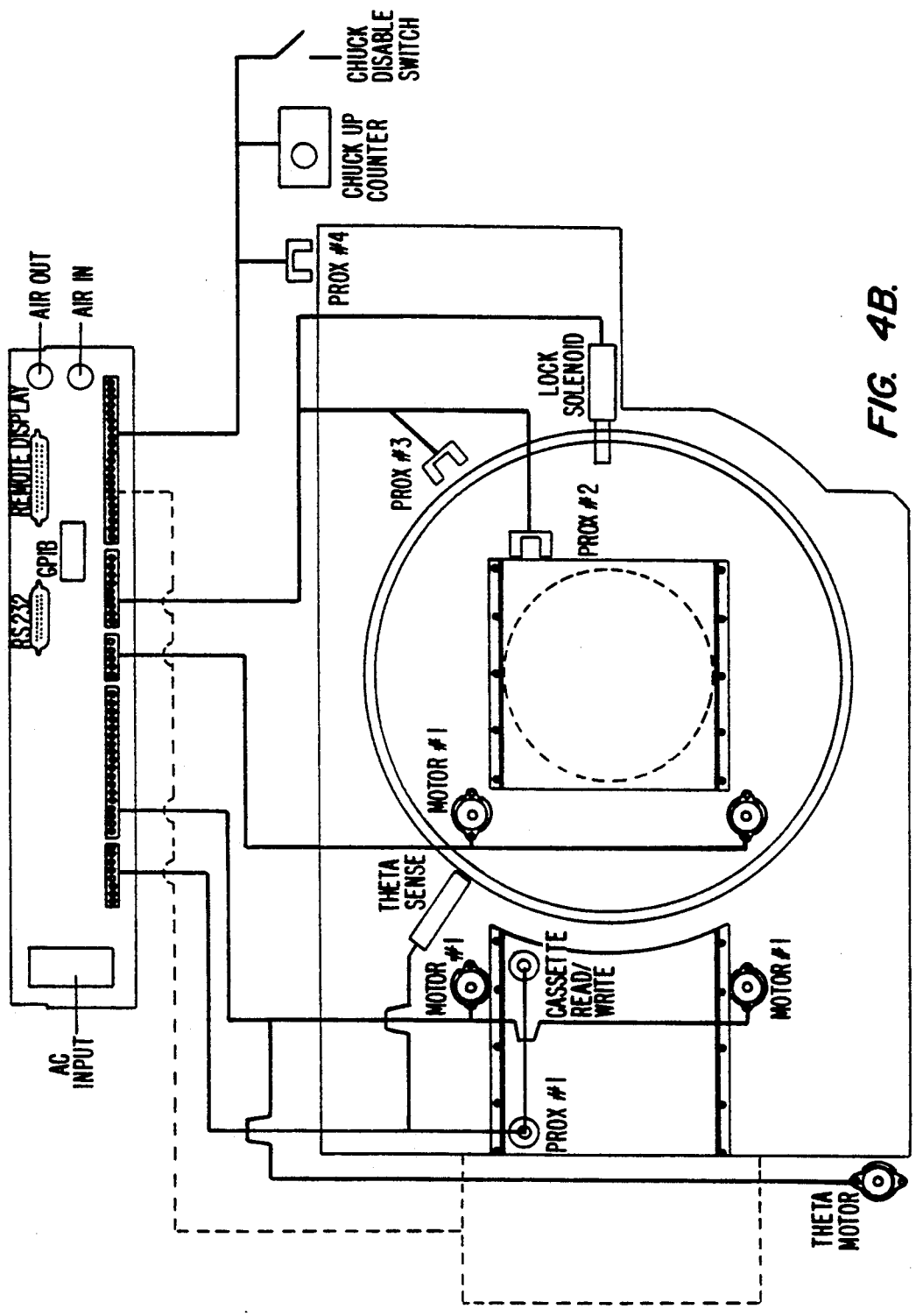

FIGS. 4A and 4B are an overall block diagram of the electronic features of the system. As shown, operation of the system is controlled by a motherboard 402 such as an A-B248 made by Acer. A user interfaces with the system via user interface 220. Software and data are input/output to the system via a conventional disk drive assembly 404. DC power is provided to the system from a conventional computer power supply 406, such as a model no. 230W made by Sanwel.

The system interfaces with the various electromechanical components via an I/0 board 408. Power is separately provided to the I/0 board for driving the various electromechanical components from an I/0 power supply 410 such as a model no. NS110-7602P made by Computer Power. A motor drive interface board 412 such as a model no. C10-D1024H made by Computer Boards, Inc. serves as an interface between the I/O board 408 and the mother board 402. A sensor interface 416 such as a model no. C10-D1024H made by Computer Boards, Inc. interfaces input/output of the various cassette sensors with the motherboard 402 while a communication interface 414 serves to input/output various data signals to/from the motherboard from the I/O board.

The I/O board outputs appropriate drive signals to motor drivers 418, as well as other electromechanical components such as the air valve/vacuum assembly 420.

In FIGS. 5A to 5E, reference is made to various proximity switches and stepper motors. For the sake of brevity, the proximity switch at the entrance to the cassette loader is referred to as proximity switch 1. The proximity switch at the fully inserted position is referred to as proximity switch 2, and the proximity switch which measures the up/down position of the probe card is referred to as switch 3. Proximity switch 4 is a chuck safe switch used for verifying safe location of the chuck at the start of loading of the cassette and ascertaining the chuck has been moved to a safe, out of the way position so the piston ring can drop down to accept the probe card without hitting the chuck. Preferably, a detector of the radial orientation of the probe card and theta assembly is also provided, and is referred to herein as the theta sensor.

The stepper motor 377 is referred to herein as the theta stepper motor (for rotation of the probe card and the theta assembly). Motors 212a at the entrance to the device, and motors 212b in the interior of the device are transport motors.

Figure 6A:
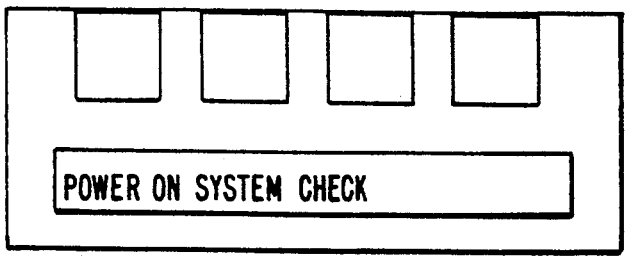
FIGS. 6A to 6X (©Copyright 1992, Xandex, Inc.) illustrate interface displays during operation of the system.

At step 501 a start up routine of the type well known to those of skill in the art is conducted. At the same time, the user interface provides the power up display shown in FIG. 6A. At the bottom of the interface, a series of 4 buttons is provided for user interface. One or more of the buttons is illuminated when the user may utilize the button(s) for input. In the display shown in FIG. 6A, no buttons are illuminated.

Figure 6B:
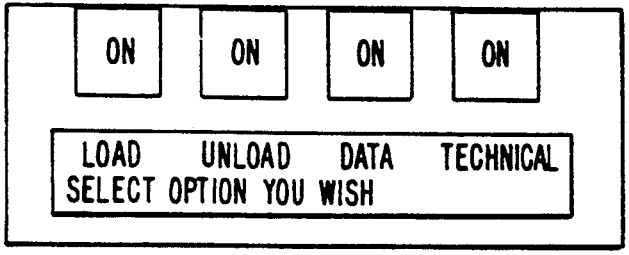
Figure 6C:
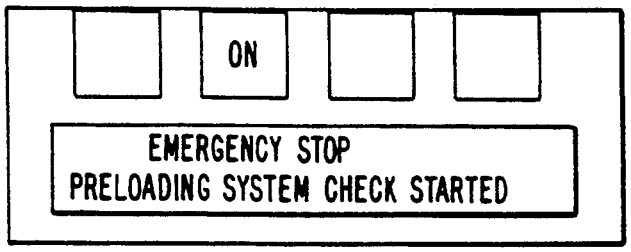
Figure 6D:
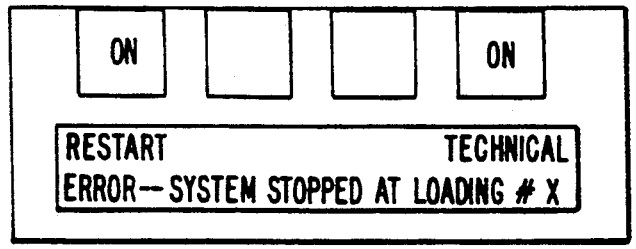
Figure 6E:
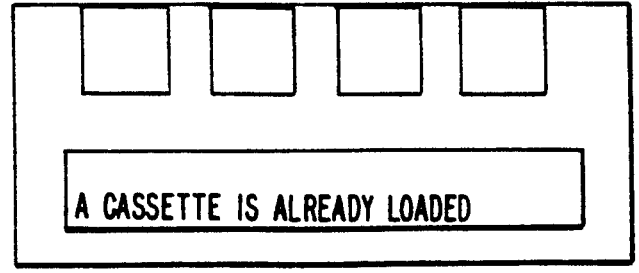
Figure 6F:
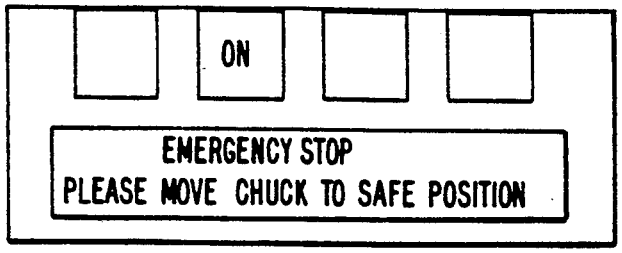
Figure 6G:
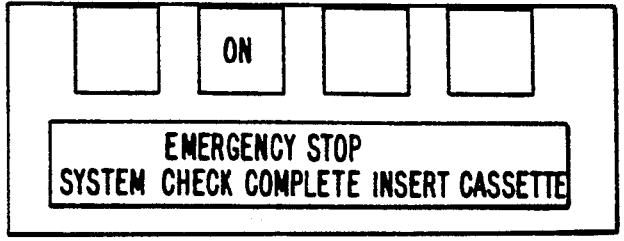
Figure 6H:
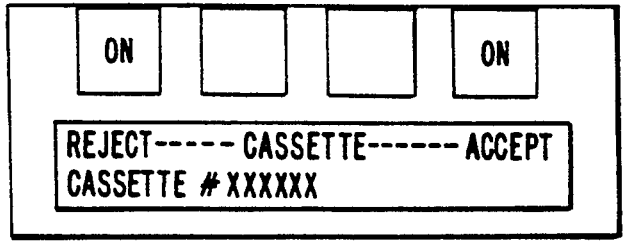
Figure 6I:
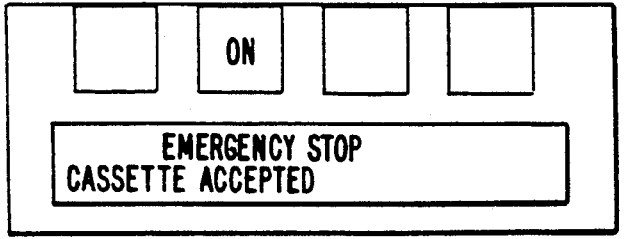
Figure 6J:
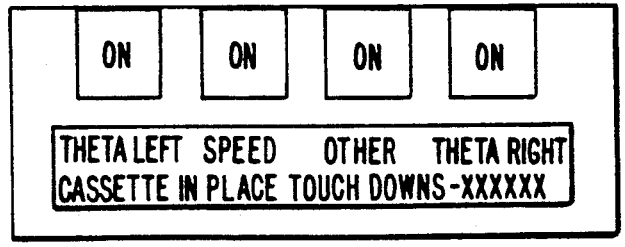
Figure 6K:
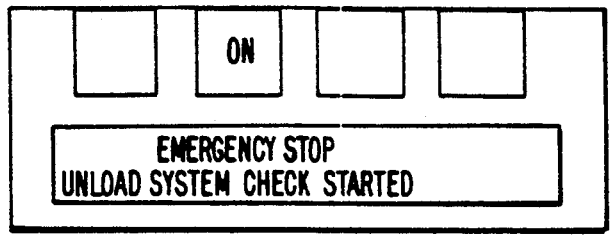
Figure 6L:
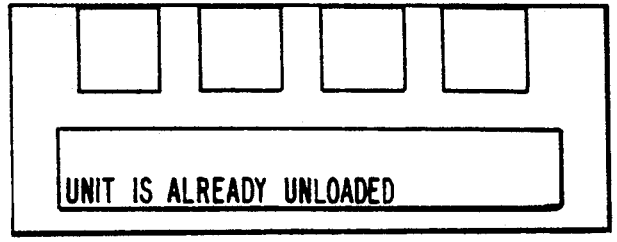
Figure 6M:
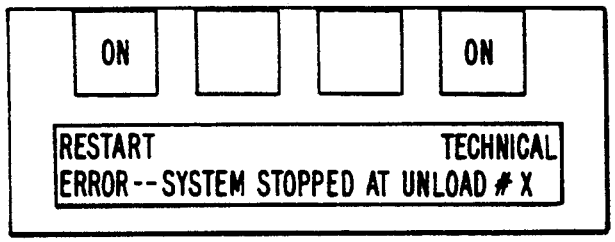
Figure 6N:
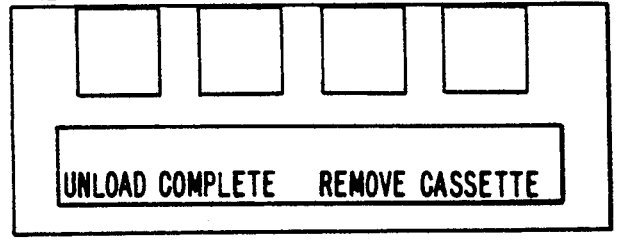
Figure 6O:
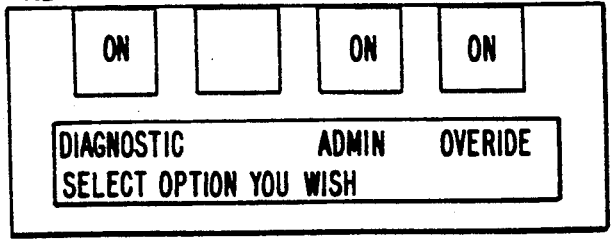
Figure 6P:
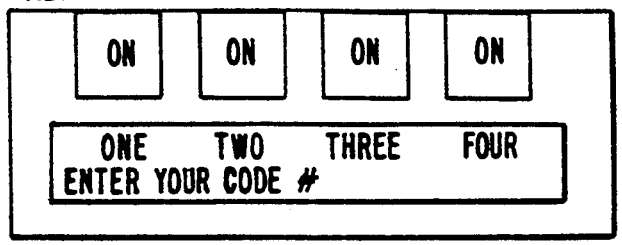

Thereafter, the display shown in FIG. 6P is provided, and the system checks for entry by the user of a password at step 502. After entry of the correct password, the system provides the display in FIG. 6B, and waits for the user to input either a probe card load or unload switch at step 503. Optionally, "data" or "technical" may be selected by the user, in which case "data" will provide the user information about the machine, and "technical" will allow the user to troubleshoot or bypass current operation and will also allow the user to change the password or diskcopy.

If the user selects "load" the system provides the display shown in FIG. 6C, and enters a path beginning with step 504 in which it is determined if a probe card is already in the device at switch 2. If so, the display shown in FIG. 6E is presented, advising the user that a cassette is already present. If not, at step 505 motors 1 and 2 are activated to reject any cassettes in the transport system. At step 506, when the proximity switch 3 is activated and if the theta assembly piston is in the down position, it is cycled. If proximity switch 3 is again contacted at step 510, the display shown in FIG. 6D is displayed, indicating a problem occurred during loading.

After completion of step 506, or if switch 3 is moved to the up position in step 510, the display shown in FIG. 6F is presented. At step 511 the system checks to determine if proximity switch 4 is contacted and the view of FIG. 6F is presented until this occurs. At step 513 the system checks the theta sensor. At steps 514 and 515 the system rotates the theta assemby right or left to line up the opening in the piston ring to match the transport assembly.

Thereafter, at step 516 the system unlocks a safety solenoid (which prevents the piston from dropping due to loss of plant air) and at step 517 the system moves the up/down piston to the down position. At step 518 the system checks proximity switch 3, and presents the display shown in FIG. 6D if the piston has not dropped down.

At step 519, when the down position is reached by the piston, the system switches to the display in FIG. 6G and checks proximity switch 1. If the switch indicates the cassette is unloaded, the system continues to recycle to step 519.

When the cassette is inserted, at step 521, the system turns on motors 212a and 212b, and at step 522 "reads" the cassette, i.e., the system reads the information stored on the cassette memory chip, preferably in a serial data transfer method using a single data contact pin. The display in FIG. 6H is then displayed. In 5-second intervals the display is as shown in FIG. 6H, and rotates to a display showing the cassette number, the number of touchdowns of the cassette, the number of touchdowns since the last maintenance, or any other probe card usage information as required by the user. Accordingly, the operator is able to monitor the cassettes to ensure they have been properly maintained before they are put into operation, or the software can make that determination and reject inappropriate cassettes.

Figure 6Q:
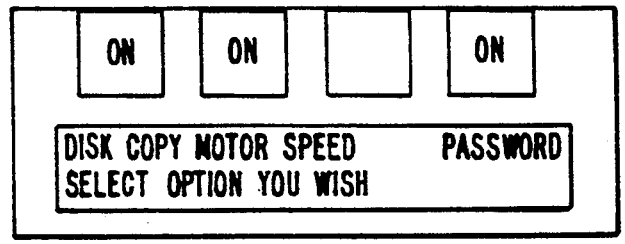
Figure 6R:
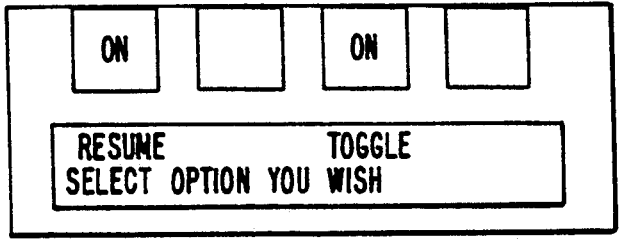
Figure 6S:
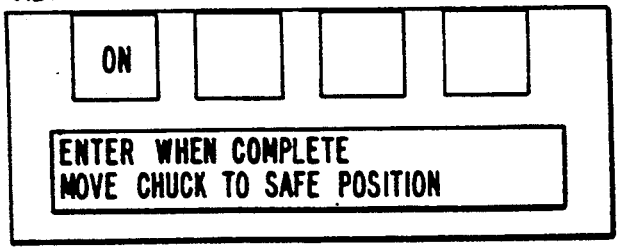
Figure 6T:
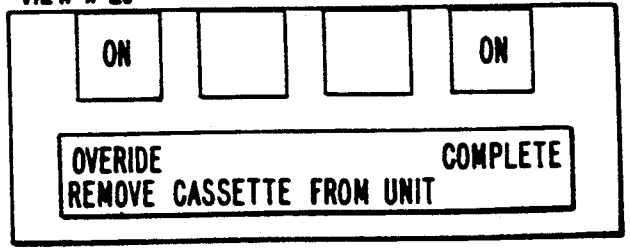

At step 523 the system prompts the operator to accept or reject the probe card, i.e., by pressing the appropriate key. If the user rejects the probe card, the system goes to FIG. 6T. If the probe card is accepted, the motors 1, 2, 3, and 4 are activated, transporting the probe card into the piston ring.

Figure 5A:
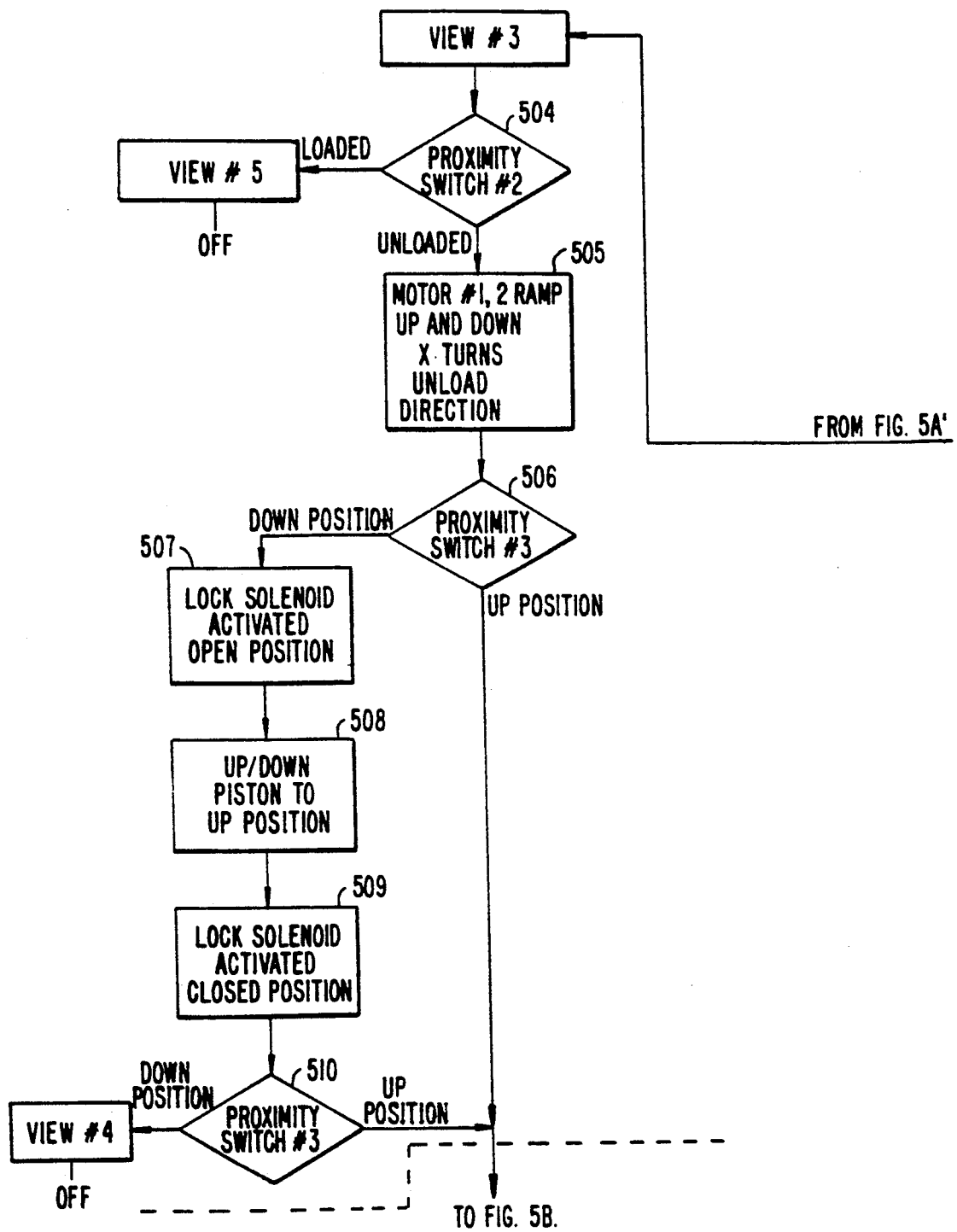
FIGS. 5A to 5E provide a flowchart illustrating operation of the autoloader assembly.
Figure 5A:
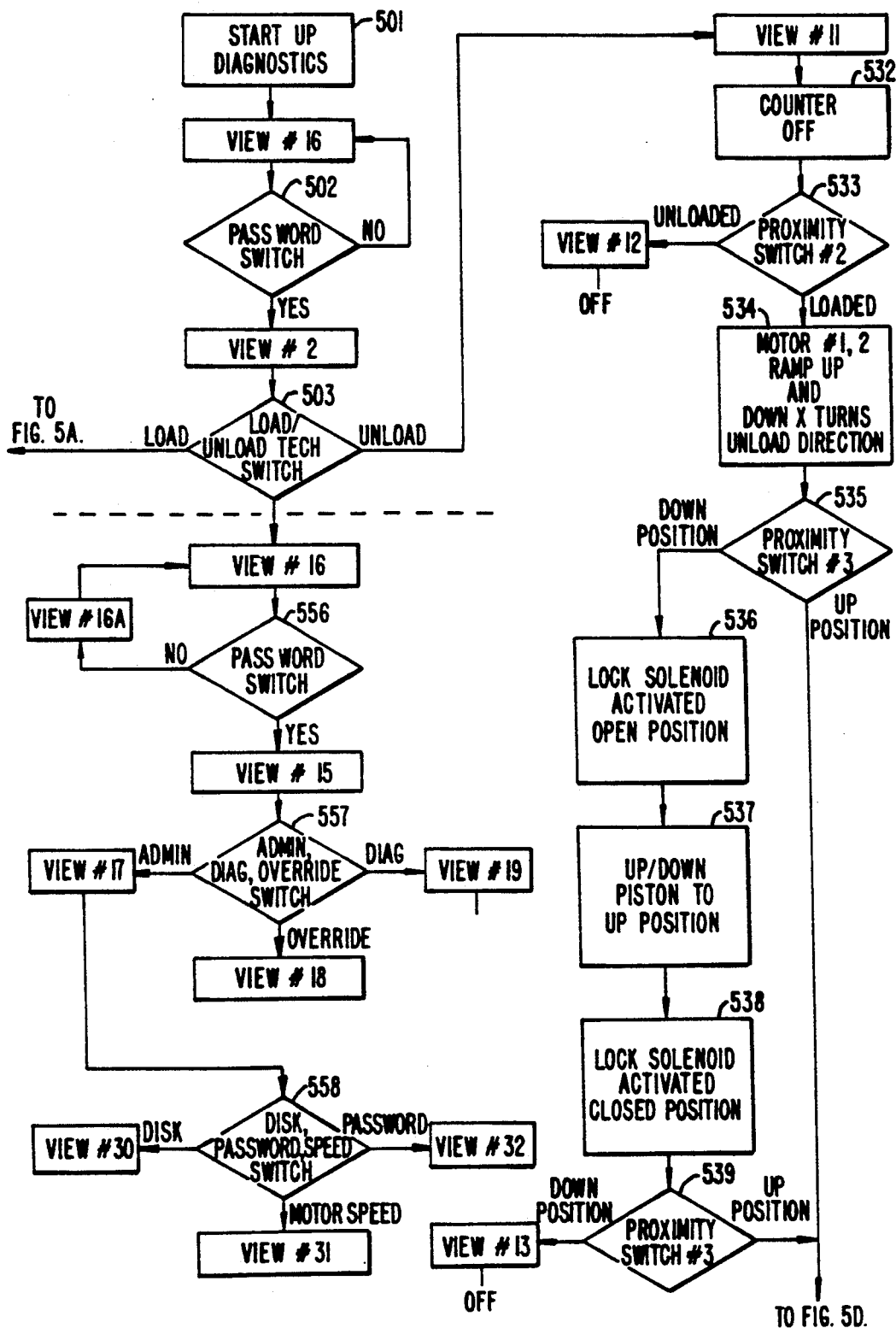
Figure 5B:
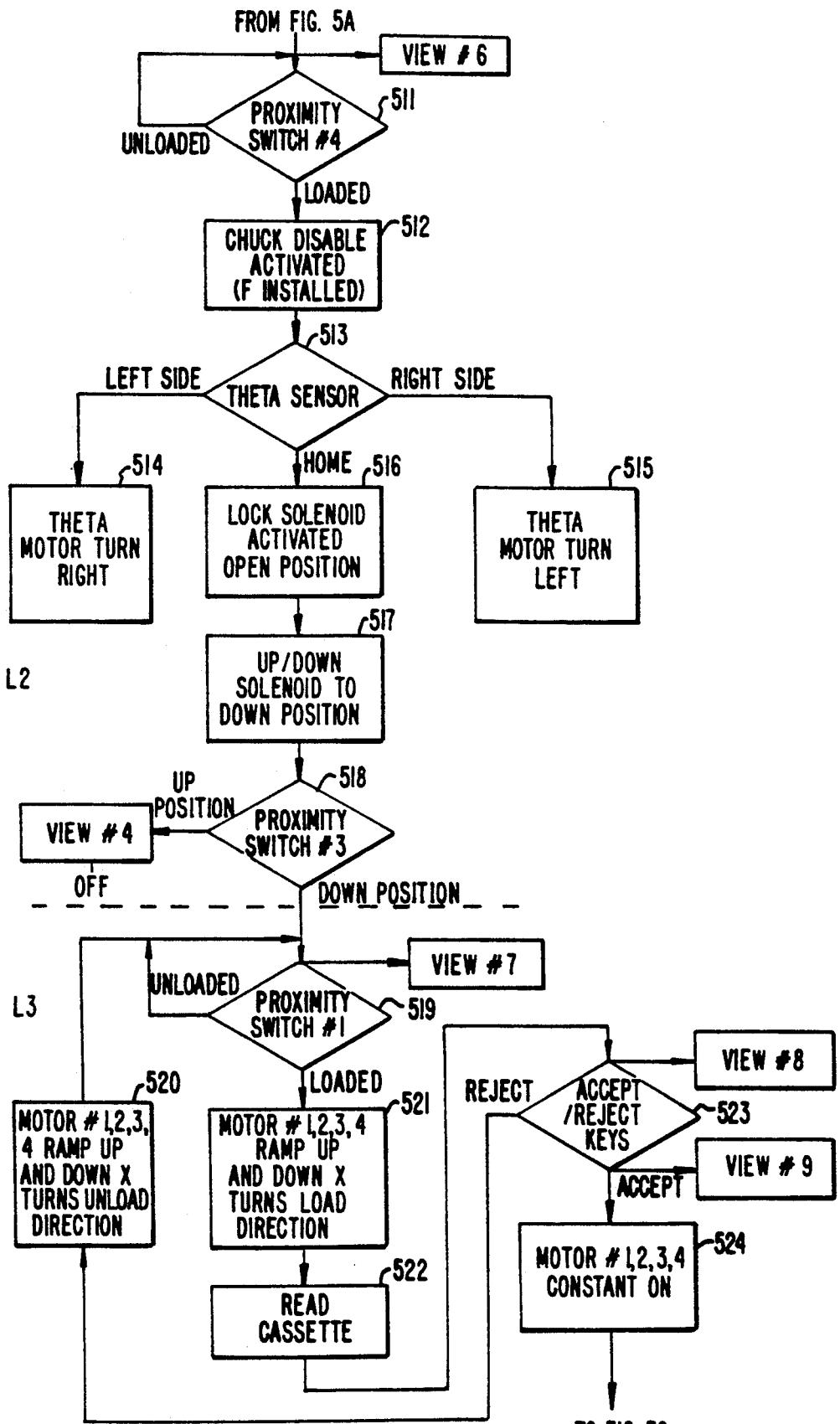
Figure 5C:
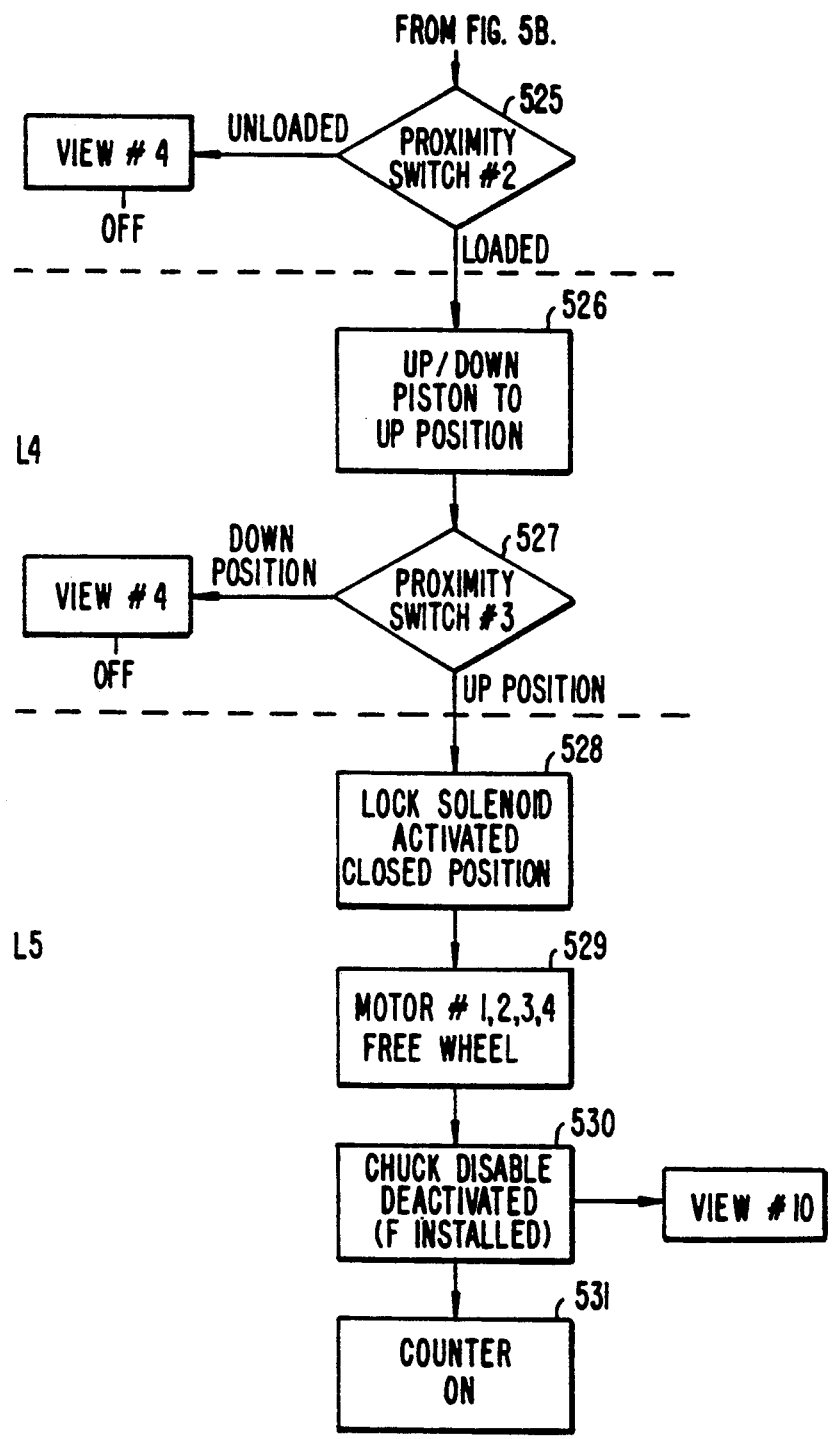
Figure 5D:
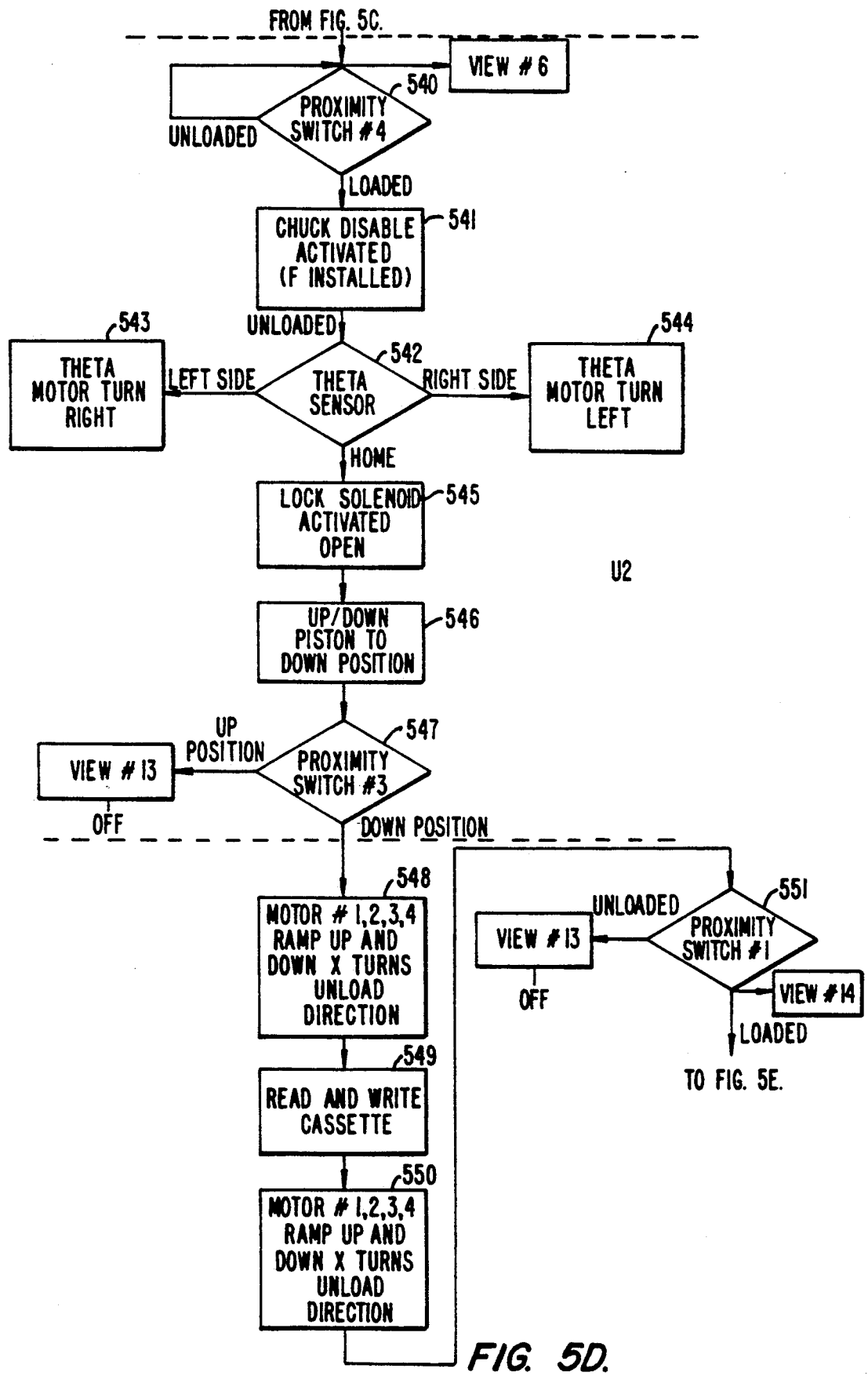
Figure 5E:
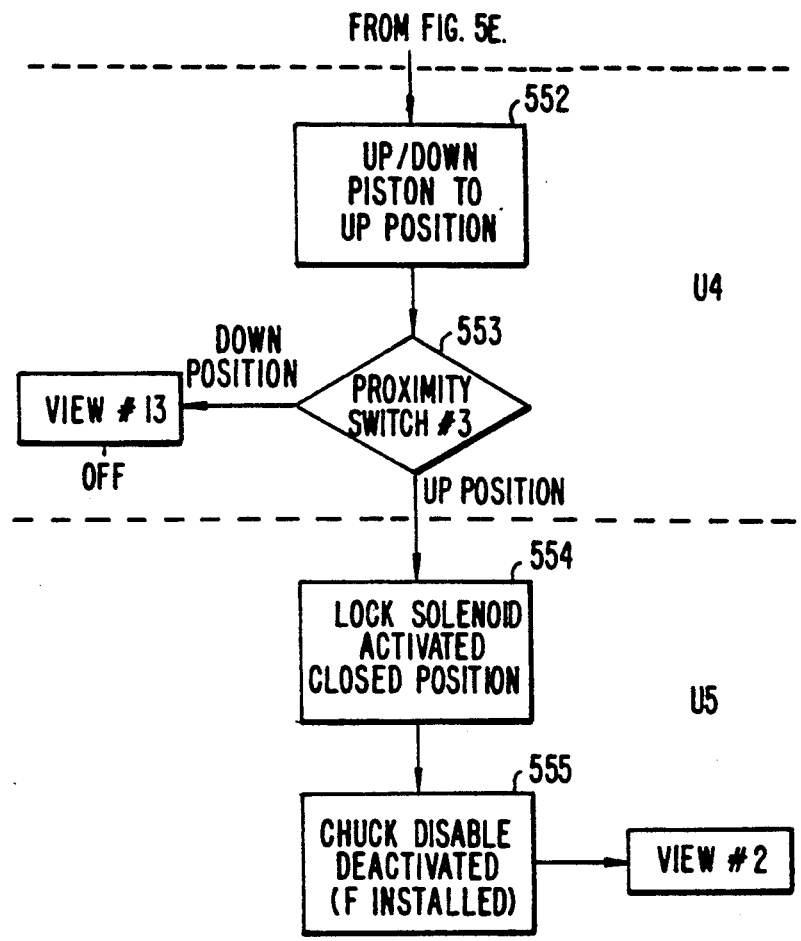

Referring to FIG. 5C, the system then checks proximity switch 2 and provides the display in FIG. 6D if the proximity switch has not turned off since the probe card has not reached its working position. When the cassette is loaded, at step 526, the system moves the up/down piston to the up position, and at step 527 monitors proximity switch 4. At step 528, when the up position is reached, the lock solenoid is activated and at step 529 the motors are turned off. At step 530 the system enables the chuck and at step 531 turns on a counter to determine the number of touchdowns conducted. The display in FIG. 6J is then provided during use.

Referring again to FIG. 5A, when the system is to be unloaded, the display provides the output shown in FIG. 6K and turns off the counter at step 532. At step 533 the system checks proximity switch 2 and displays the output shown in FIG. 6L if a cassette is not detected. If a cassette is detected, the system activates motors 1 and 2 in the unload direction and at step 535 monitors proximity switch 3. When the piston is in the down position, the lock solenoid is activated to the open position at step 536, and at step 537 the piston is moved to the up position. The lock solenoid is then activated to the closed position, and at step 539 the system monitors proximity switch 3 to detect the piston in the up position.

When the piston reaches the up position, the system shows the view in FIG. 6F. Proximity switch 4 is monitored at step 540, and unless the chuck is detected, the display in FIG. 6F is constant.

At steps 542, 543, and 544 the theta motor adjusts the theta assembly as needed to again line up the openings in the piston ring to those of the transport assembly. At step 545 the system locks the solenoid in the open position and at step 546 the piston is moved to the down position. At step 547 the system checks proximity switch 3, and provides the display in FIG. 6M if the piston has not reached the down position.

At step 548 the system turns on the various motors, and moves the cassette to the memory cell data transfer device. At step 549, the cassette memory is written upon, adding new and updated information regarding usage such as the number of touchdowns. At step 550 the motors finish transport of the cassette out of the unit. At step 551 proximity switch 1 is monitored, and the display in FIG. 6M is provided if the cassette does not complete the exit path. When proximity switch 1 is activated, the display in FIG. 6N is displayed. After the operator has removed the cassette, the piston moves to the up position (552 in FIG. 5E), proximity switch 3 detects the piston is up, the lock solenoid is activated (554), and it is again O.K. to move the chuck. If, in step 553, the piston is not detected in the up position then FIG. 6M is shown.

Figure 6U:
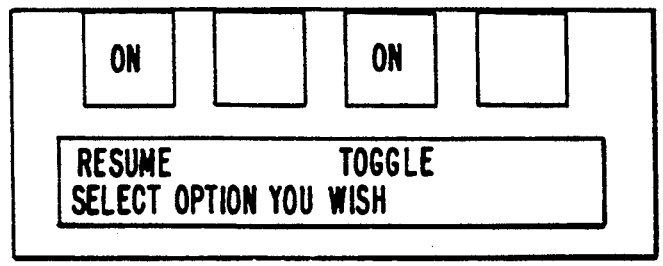
Figure 6V:
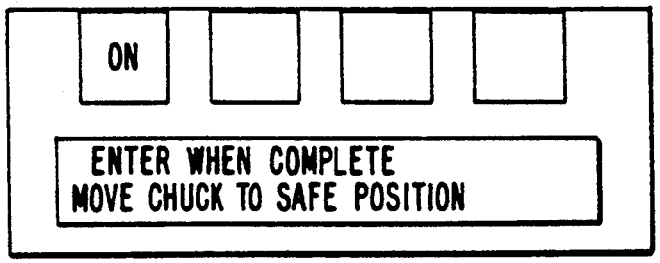
Figure 6W:
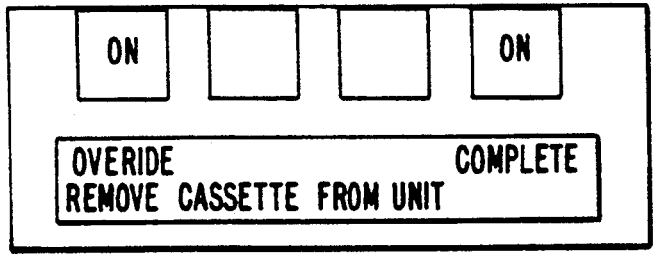
Figure 6X:
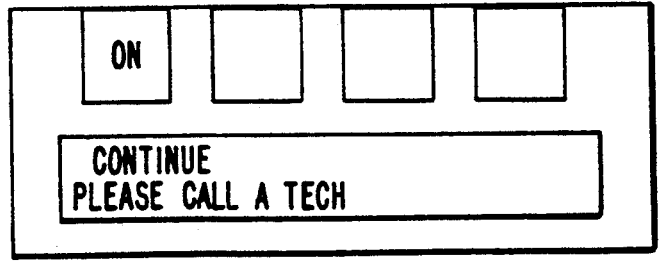

Referring again to FIG. 5A, steps 556 to 558 are activated by pressing either the "data" or "technical" button. The system provides the display in FIG. 6P for entry of a password, and if the incorrect password is entered the system provides the display in FIG. 6X. When the proper password is entered the screen if FIG. 6O is provided, and at step 557 the system prompts the operator for input. Depending upon the entry at step 557, the system provides either the display in FIG. 6Q, 6R, or 6S. If admin. is selected, at step 558 the system prompts the operator for input and, depending on the selection by the user, provides the display in FIG. 6U, 6V, or 6W.

Appendix 1 (° Copyright 1993, Xandex, Inc.) provides representative software for operation of the system in c.

Figure 7A:
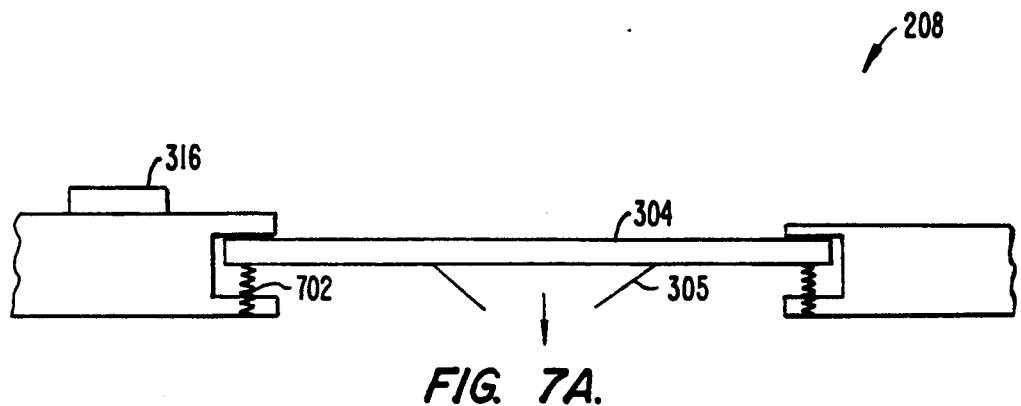
FIGS. 7A and 7B illustrate biasing of the probe card in the cassette.
Figure 7B:
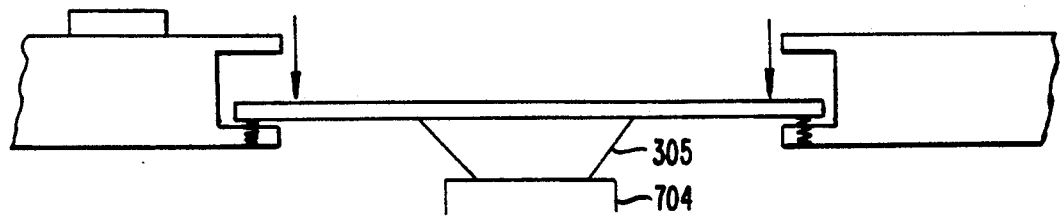

FIGS. 7a-b illustrate the cassette 208 in greater detail. As shown, the cassette includes a probe card 304 with probes 305 extending downwardly therefrom. The probe card is mounted movably in the cassette such that it can move from an upwards position shown in FIG. 7A to a downwards position shown in FIG. 7B. The cassette includes springs 702 or a similar resilient member such that the probe card is normally biased upwards in the cassette as shown in FIG. 7A. Accordingly, the probes 305 do not extend below the body of the cassette under normal circumstances. However, when the system presses or pulls downwardly on the card, the probes extend below the body such that they can make contact with a wafer 704.

The above description is illustrative and not restrictive. Many variations of the invention will become apparent to those of skill in the art upon review of this disclosure. Merely by way of example a wide variety of circuit elements could be utilized in place of those described herein, circuit elements could be replaced with software functionality, or software functionality could be replaced with circuit elements. The scope of the invention should, therefore, be determined not with reference to the above description, but instead should be determined with reference to the appended claims along with their full scope of equivalents.

What is claimed is:

1. A wafer test system comprising:
   a) a plurality of cassettes, each of said cassettes comprising a wafer probe card and memory means, said memory means adapted to store operational data regarding said wafer probe card; and
   b) loading means for removing and inserting said cassettes into said test system.

2. A wafer test system as recited in claim 1 wherein said operational data comprises a number of probe touchdowns.

3. A wafer test system as recited in claim 1 wherein said memory means is a serial memory device having a single data input contact.

4. A wafer test system as recited in claim 3 further comprising a wafer prober, and wherein said loading means further comprises a plurality of stepper motors, said stepper motors engaging said cassettes to drive aid cassettes into said wafer prober.

5. A wafer test system as recited in claim 3 further comprising a wafer prober and a detector for determining when said cassette is fully inserted into said wafer prober.

6. A wafer test system as recited in claim 1 wherein said wafer probe cards are removable from said cassettes.

7. A wafer test system as recited in claim 1 wherein said wafer probe cards comprise delicate probe tips, said probe tips biased away from an exterior of said cassette, said probe tips moved outwards of said exterior of said cassette upon reaching a working position in a wafer prober.

8. A wafer test system as recited in claim 7 wherein said probe card is biased in said cassette with springs.

9. A wafer test system as recited in claim 1 wherein said memory is adapted to store the information selected from a group of Touchdowns, Serial number, Date of last maintenance, Date of manufacture, Failure nature of probes, Location of failed probes, operator's I.D., Scheduled maintenance date, Scheduled maintenance touchdowns, and Previous radial orientation.

10. A wafer test system as recited in claim 1 further comprising a transport assembly for loading said cassettes into said system.

11. A wafer test system as recited in claim 10 wherein said transport assembly comprises tracks for guiding said cassettes into said system, and stepper motors for driving said cassettes into a selected position.

12. A wafer test system as recited in claim 1 further comprising a memory data transfer means in said wafer test system for both writing to and reading from said memory.

13. A wafer test system as recited in claim 1 further comprising a display, said wafer test system adapted to read said memory and display a number of touchdowns on said display when said cassettes are loaded into said system.

14. A wafer test system as recited in claim 13 wherein said system is adapted to display maintenance history information regarding said cassettes.

15. A wafer test system as recited in claim 1 wherein said memory is adapted to interface with a standard RS-232 data bus.

16. A wafer test system as recited in claim 1 wherein said cassettes comprise a real time clock for time stamping usage and maintenance durations.

17. A wafer test system as recited in claim 1 further comprising a magazine for holding a plurality of said cassettes, and means for loading a selected one of said cassettes into said system from said magazine.

18. A wafer test system as recited in claim 17 wherein said selected one of said cassettes is selected based on input regarding a wafer product from a user interface.

19. A semiconductor wafer probe card cassette comprising:
   a body;

a probe card mounted in said body, said probe card comprising a plurality of probes for transmitting electrical signals to a semiconductor wafer; and a semiconductor memory mounted on said cassette, said semiconductor memory storing operational data regarding said probe card.

20. A semiconductor wafer probe card cassette as recited in claim 19 wherein said semiconductor memory is mounted on said body.

21. A semiconductor wafer probe card cassette as recited in claim 19 wherein said semiconductor memory is mounted on said probe card.

22. A semiconductor wafer probe card cassette as recited in claim 19 wherein said semiconductor memory comprises a single data input/output terminal, said semiconductor memory adapted to input and output data in a serial manner.

23. A semiconductor wafer probe card cassette as recited in claim 19 wherein said probe card is movably mounted in said body whereby said probe card can move from a first position to a second position, said probe card comprising probe pins extending from said probe card, said probe pins extending outside of said body in said first position, but not extending from said body in said second position.

24. A system for testing semiconductor wafers comprising:

a) a plurality of cassettes, each of said cassettes comprising a wafer probe card and a semiconductor memory, said semiconductor memory adapted to serially input and output a number of touchdowns of said wafer probe card to said semiconductor wafers; and b) a transport assembly for moving a selected one of said cassettes into a wafer prober, said transport assembly comprising a single data input pin for serially reading a said number of touchdowns from said semiconductor memory when said cassettes are inserted into said wafer prober, and for inputting an updated number of touchdowns to said memory when said cassettes are removed from said wafer prober.

25. A system as recited in claim 24 wherein said wafer probe cards are biased in said cassettes such that probe tips on said probe card are normally biased so as to not extend outside of said cassettes.

26. A system as recited in claim 25 wherein said system further comprises a slidable piston for forcing said wafer probe card in a direction such that said probe tips extend from said cassettes for testing, and wherein said system is programmed to prevent insertion of said cassettes when said piston is in a position for forcing said wafer probe card such that said probe tips extend from said cassettes.

27. A system as recited in claim 24 further comprising a menu driven user interface, said user interface advising a user for how to insert said cassettes into said system.

28. A system as recited in claim 24 further comprising a controller means, said controller means being programmed to reject said cassettes if said number of touchdowns exceeds a selected value.

29. A system as recited in claim 24 wherein said semiconductor memory is adapted to store a previous radial orientation of said probe card, said previous radial orientation being used for proper alignment of said probe card upon insertion into said system.

* * * * *